United States Patent [19]

Roberts

[11] Patent Number: 4,628,270

[45] Date of Patent: Dec. 9, 1986

[54] FREQUENCY-AGILE SYNCHRONOUS DEMODULATOR

[75] Inventor: Richard D. Roberts, Palm Bay, Fla.

[73] Assignee: Harris Corporation, Melbourne, Fla.

[21] Appl. No.: 721,747

[22] Filed: Apr. 10, 1985

[51] Int. Cl.$^4$ ............................................. H03D 3/02
[52] U.S. Cl. ..................................... 329/50; 329/124; 375/81; 375/120
[58] Field of Search .................... 329/50, 122, 124; 375/81, 120

[56] References Cited

U.S. PATENT DOCUMENTS

| | | | |
|---|---|---|---|
| 3,212,023 | 10/1965 | Broadhead | 331/11 |
| 3,638,125 | 1/1972 | Goell | 325/320 |
| 3,768,030 | 10/1973 | Brown et al. | 331/12 |
| 3,769,602 | 10/1973 | Griswood | 329/122 |
| 4,048,566 | 9/1977 | Carson et al. | 325/329 |
| 4,238,739 | 12/1980 | Mosley et al. | 331/12 |
| 4,408,351 | 10/1983 | Maurer et al. | 455/260 |
| 4,465,982 | 8/1984 | Jernakoff | 331/1 A |
| 4,472,685 | 9/1984 | Dutasta | 329/50 |

OTHER PUBLICATIONS

IEEE Transactions on Communications, vol. COM-26, No. 1, Jan. 1978, "The False Lock Performance of Costas Loops with Hard-Limited In-Phase Channel", by M. K. Simon.
IEEE Transactions on Communications, vol. COM-26, No. 4, Apr. 1978, "Tracking Performance of Costas Loops with Hard-Limited In-Phase Channel", by M. K. Simon.

Primary Examiner—Eugene R. LaRoche
Assistant Examiner—J. C. Lee
Attorney, Agent, or Firm—John L. DeAngelis, Jr.

[57] ABSTRACT

A frequency-agile synchronous demodulator for demodulating a carrier signal. The carrier signal is decomposed into in-phase and quadrature-phase components. Using the in-phase and quadrature-phase components, a first error signal is produced representing the phase difference between the carrier signal and a local oscillator signal. A reference signal, related to the frequency of the carrier signal by a factor N, is also input to the frequency-agile synchronous demodulator. The local oscillator signal is scaled by the factor N, and compared to the reference frequency signal in a phase detector. The phase detector produces a second error signal representing the phase difference between the reference signal and the local oscillator signal. The first error signal is integrated and summed with the second error signal. The resultant sum signal is integrated and input to the local oscillator for controlling the frequency and phase thereof. Generation of the second error signal ensures that the frequency-agile synchronous demodulator locks to the correct carrier frequency signal, rather than another signal on an adjacent frequency. The first error signal ensures a phase-locked condition.

37 Claims, 1 Drawing Figure

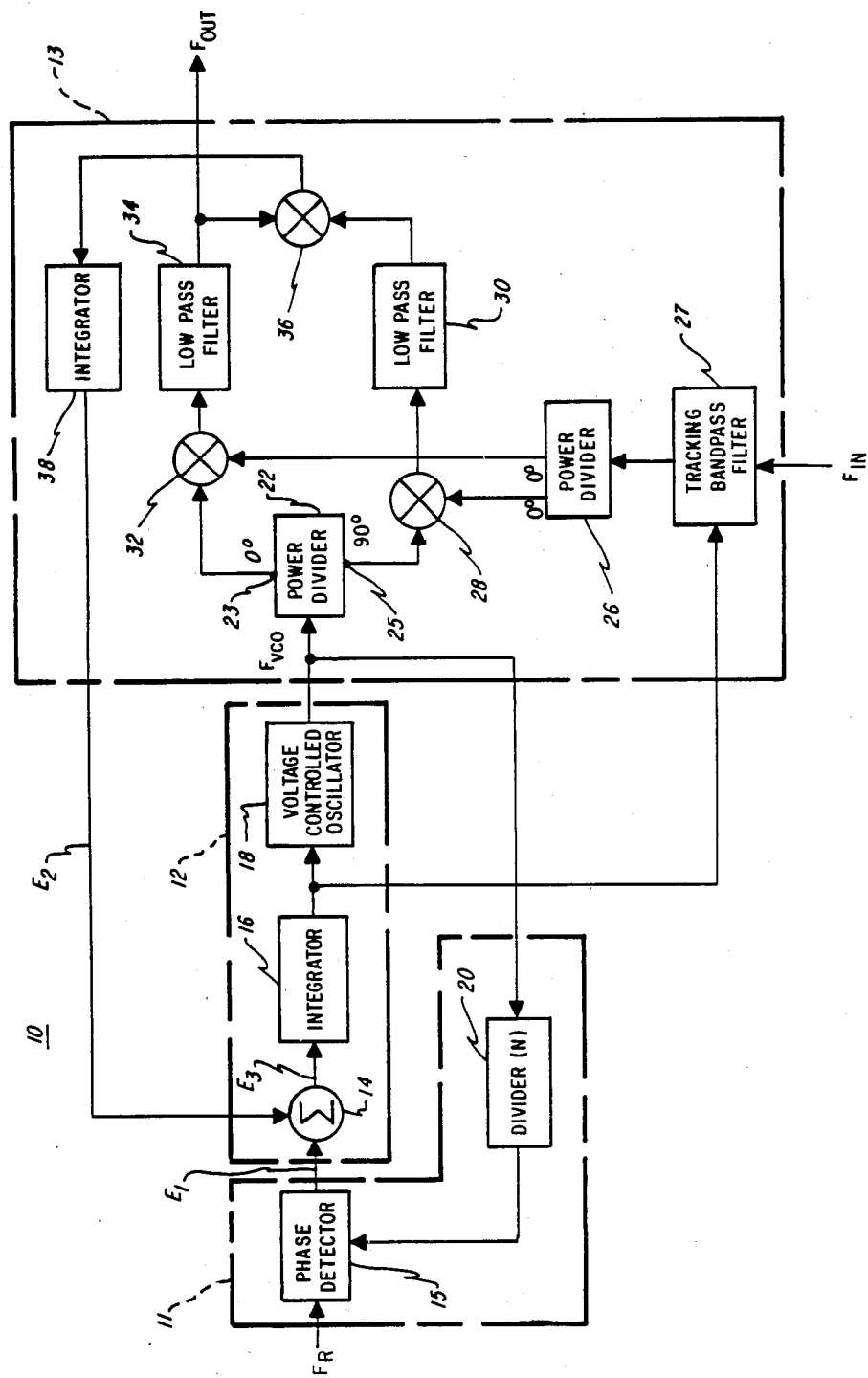

FREQUENCY-AGILE SYNCHRONOUS DEMODULATOR

FIELD OF THE INVENTION

This invention relates generally to synchronous demodulators, and more specifically, to a frequency-agile (i.e. tunable) synchronous demodulator for producing an oscillating signal that can be varied in both frequency and phase until the frequency and phase are coherent with a modulated carrier signal, for use in the demodulation thereof.

BACKGROUND OF THE INVENTION

Synchronous detection is one technique for recovering the information signal from certain modulated carrier signals. Any linear modulation scheme (AM, DSB, SSB, and VSB) or biphase-shift keyed modulation can be demodulated by synchronous detection. Because the local oscillator of the synchronous detector must be phase synchronized (i.e., phase coherent) with the modulated carrier signal, a feedback loop, such as a phase-locked loop or a Costas loop, controls the phase of the local oscillator. The feedback loop synchronizes the phase of the local oscillator and the modulated carrier signal to ensure proper demodulation. Any synchronous detector can be tuned to provide demodulation for a range of modulated carrier signal frequencies by changing the frequency of the local oscillator. This is accomplished by opening the feedback loop, tuning the resonant circuit components of the local oscillator to the new frequency, and then closing the feedback loop. When closed again, the feedback loop will synchronize the phase of the local oscillator and the modulated carrier signal at the new frequency.

In a typical receiver employing synchronous detection, the input modulated carrier signal is band-pass filtered and down-converted to an intermediate frequency using conventional techniques. Various intermediate-frequency amplifying and filtering stages follow the down-conversion; these stages have a narrow bandwidth to provide adjacent channel rejection. Demodulation is accomplished by mixing the intermediate frequency signal with a local oscillator signal, from a voltage-controlled oscillator. The frequency of the local oscillator signal is the intermediate frequency and the phase thereof is controlled by a feedback loop so the local oscillator signal and the intermediate frequency demodulate, and the local oscillator phase is locked to the phase of the incoming modulated carrier. The frequency and phase coherent local oscillator and modulated carrier signals are mixed, producing a difference-frequency component that reduces to zero because the mixed signals are frequency and phase coherent, and a double-frequency component that is removed by low-pass filtering. The remaining component is the information signal. Because intermediate frequency components are absent in such a system, means must be included to provide adjacent channel rejection. Tuning of the local oscillator is accomplished in U.S. Pat. No. 4,408,351 by using an adder to sum an externally-produced tuning signal and the feedback signal produced by the phase-locked loop. The sum is input to the voltage-controlled oscillator and the input bandpass filter for tuning these elements to receive the desired modulated carrier signal.

As used in a typical prior art receiver, the Costas loop includes a voltage-controlled oscillator with an oscillation frequency equal to the intermediate frequency. In the Costas loop, the oscillator signal mixes, in a first mixer, with the intermediate frequency signal. The oscillator signal is also phase shifted by ninety degrees and the resulting quadrature signal is mixed, in a second mixer, with the intermediate frequency signal. The resultant signals from the first and second mixers are multiplied to produce an error signal. The error signal controls the phase of the voltage-controlled oscillator signal to match the phase of the incoming intermediate frequency signal so that demodulation thereof occurs in the first mixer. One disadvantage of the Costas loop is that it may lock onto a signal at a frequency adjacent to the desired frequency. This disadvantage can be overcome by using a crystal as the voltage-controlled oscillator. This eliminates problems associated with the Costas loop locking onto a signal at a frequency adjacent to the desired frequency, but then the local oscillator frequency can be changed only by changing the crystal. When used with an intermediate frequency technique, the Costas loop would likely use a crystal as the voltage-controlled oscillator, with the crystal frequency equal to the intermediate frequency. The intermediate frequency stages provide adjacent channel rejection, and the crystal oscillator ensures that the Costas loop locks to the correct frequency.

As an alternative to the use of the crystal as the voltage-controlled oscillator, it is possible to employ a tunable band-pass filter before the Costas loop and allow the voltage-controlled oscillator of the Costas loop to be tunable. If the band-pass filter has a very high Q only a very narrow band of frequencies will pass therethrough. With only a narrow band of frequencies presented to the Costas loop, there would be an increasingly high probability that the Costas loop would lock to the correct frequency. Such a high-Q bandpass filter would, however, be expensive and complex. This high-Q bandpass filter also provides protection against adjacent channel interference.

One attempted technique for locking the Costas loop to the correct frequency and phase is to employ both a synthesizer phase detector and a Costas detector. The synthesizer phase detector provides frequency coherency (i.e., synchronization) using an externally generated reference signal. The Costas detector provides phase coherency. The synthesizer phase detector and the Costas detector are alternately switched into and out of a feedback loop controlling the voltage-controlled oscillator, such that at one instant the Costas detector provides the error signal to the voltage-controlled oscillator and during the next instant the synthesizer phase detector provides the error signal. One disadvantage associated with this scheme is a frequency offset caused by the closing of the switch. The switch closure introduces a step voltage that shifts the frequency of the voltage-controlled oscillator. Also, the voltage-controlled oscillator can still lock onto a false or adjacent signal while the Costas detector is in control.

SUMMARY OF THE INVENTION

A frequency-agile synchronous demodulator is disclosed. The present invention overcomes the disadvantages discussed above by employing frequency and phase control loops.

A modulated carrier signal containing information in the phase reversals thereof is demodulated by mixing with a local oscillator signal, which is phase coherent with the modulated carrier signal. According to the disclosed inventive principles, the frequency-agile synchronous demodulator is tunable, thereby allowing it to demodulate any modulated carrier signal within the tuning range thereof.

Further, the demodulation is performed directly, without passive or active filtering (such as bandpass filtering) or without conversion to an intermediate frequency. A local oscillator signal $F_{VCO}$ is controlled to match the frequency and phase of the desired modulated carrier signal $F_{IN}$ so direct demodulation of only the desired modulated carrier signal $F_{IN}$ occurs.

Further according to the inventive principles, a frequency control loop is responsive to a frequency reference signal $F_R$ and the local oscillator signal $F_{VCO}$. The frequency of $F_{VCO}$ or $F_R$ may be converted to ensure $F_R$ and $F_{VCO}$ are sufficiently near each other in frequency when compared in the frequency control loop. The frequency control loop produces a first error signal representing the phase difference between $F_{VCO}$ and $F_R$. A phase control loop (a phase-locked loop) produces a second error signal representing the phase difference between the modulated carrier signal $F_{IN}$ and $F_{VCO}$. In the preferred embodiment, the phase control loop comprises a Costas loop, for demodulation of $F_{IN}$. Further according to the inventive principles, tuning is accomplished by converting the frequency of $F_{VCO}$, for example by dividing as shown in the preferred embodiment so that the first error signal represents the phase difference between $F_R$ and $F_{VCO}$ scaled to the frequency of $F_R$. The frequency-control and the phase-control loop then produce frequency and phase error signals to drive the frequency and phase of $F_{VCO}$ to frequency and phase synchronization with $F_{IN}$. In the preferred embodiment the response time of the frequency control loop is made faster than the response time of the phase control loop so frequency correction takes place in a shorter time than phase correction. In this way, the output of the local oscillator is substantially at the frequency of the desired modulated carrier $F_{IN}$ so phase correction and demodulation may take place by direct application of the local oscillator signal $F_{VCO}$ to the desired modulated carrier $F_{IN}$.

In the preferred embodiment the first error signal from the frequency control loop is summed with the second error signal (from the phase control loop). The sum is applied to the input of the local oscillator as a combined error signal for driving the local oscillator signal $F_{VCO}$, into frequency and phase coherence with the desired modulated carrier $F_{IN}$.

With this invention, the disadvantages of the prior art are avoided. That is, it is unnecessary to employ bandpass filters or IF stages to tune to a desired carrier from a plurality of carriers within a broad band input. It is also unnecessary to provide a separate independent tuning voltage to the local oscillator, to establish the correct frequency for the local oscillator signal $F_{VCO}$ relative to the desired modulated carrier signal $F_{IN}$.

BRIEF DESCRIPTION OF THE DRAWING

The invention may be better understood, and further advantages and uses thereof more readily apparent, when considered in view of the following detailed description of exemplary embodiments, taken with the accompanying Figure, which is a block diagram of a frequency-agile synchronous demodulator constructed according to the teachings of the present invention.

DESCRIPTION OF THE PREFERRED EMBODIMENTS

Turning to the Figure, there is shown a frequency-agile synchronous demodulator 10 constructed according to the teachings of the present invention. The frequency-agile synchronous demodulator 10 includes a frequency-control loop 11 responsive to a reference-frequency signal $F_R$, and producing a first error signal $E_1$ input to an oscillator 12. A phase-control loop 13 is responsive to a modulated carrier signal $F_{IN}$ for producing a second error signal $E_2$ input to the oscillator 12. A signal $F_{OUT}$ representing the information signal modulating the modulated carrier signal $F_{IN}$ is also produced in the phase-control loop 13. $E_1$ and $E_2$ are summed to produce an error signal $E_3$; in response to $E_3$ the oscillator 12 produces a local oscillator signal $F_{VCO}$ that is phase and frequency synchronized to $F_{IN}$ to demodulate $F_{IN}$ in the phase-control loop 13.

The modulated carrier signal $F_{IN}$ can be any carrier signal modulated in linear fashion, by an information signal, or any carrier signal modulated such that the information is contained in the phase reversals thereof. For example, in one embodiment of the present invention $F_{IN}$ is a biphase-shift-keyed signal, and in another embodiment $F_{IN}$ is a double-sideband suppressed carrier signal. Also, the frequency of $F_{IN}$ is related to the reference frequency by a factor N, i.e., $F_{IN}=NF_R$.

It is the nature of the frequency control loop 11 and the oscillator 12 that if a dc voltage is summed into the closed loop the phase of the local oscillator signal $F_{VCO}$ (the synthesized signal) is changed but not the frequency thereof. In the present invention this summed-in voltage is the error signal $E_2$. $E_2$ is summed into the loop, reducing the phase error between $F_{VCO}$ and the modulated carrier signal $F_{IN}$, without changing the frequency. Due to the frequency and phase coherency between the reference signal $F_R$ and $F_{IN}$, demodulation occurs in the phase-control loop 13.

Simplistically, it can be said that the error signal $E_2$ controls the phase of the local oscillator signal $F_{VCO}$, and the error signal $E_1$ controls the frequency thereof. In practice, however, the situation is more complex because these signals interact to control the frequency and phase of $F_{VCO}$, produced by the oscillator 12, and the frequency of any signal cannot be changed without effecting the phase thereof. In the preferred embodiment the closed-loop bandwidth of the frequency-control loop 11 is substantially greater than the closed-loop bandwidth of the phase-control loop 13. This condition ensures that phase locking at the correct frequency will occur. Stated somewhat differently, the time-constant of the frequency-control loop 11 must be very fast compared to the time constant of the phase control loop 13.

Tuning is accomplished in the frequency-control loop 11 by comparing the frequency of the frequency-reference signal $F_R$ with the frequency of the local oscillator signal $F_{VCO}$ converted by a constant N to the scale of $F_R$. The result is the error signal $E_1$. $E_1$ is input to the oscillator 12 for controlling the frequency of $F_{VCO}$, such that the relationship $F_{VCO}=F_{IN}=NF_R$ is satisfied with respect to the frequencies of the signals. Although there is a spectrum of signals available at the input of the phase-control loop 13, the signal $F_{VCO}$ from the oscillator 12 locks on the modulated carrier signal $F_{IN}$ and demodulates $F_{IN}$ in the phase-control loop 13.

Continuing with the discussion of FIG. 1, a voltage-controlled oscillator 18, within the oscillator 12, produces the local oscillator signal $F_{VCO}$ that is input to a power divider 22. The power divider 22 produces an in-phase signal at an output terminal 23 thereof that is in phase with $F_{VCO}$. The power divider 22 also produces a quadrature-phase signal at an output terminal 25 thereof. The quadrature-phase signal has the same frequency, but is 90 degrees out of phase with $F_{VCO}$. Typically, a power divider produces two or more output signals identical to the signal input thereto, such that the sum of the output signal powers equals the signal input power, except for losses within the power divider. Power dividers can also produce output signals having any predetermined phase relationship with the input signal.

The modulated carrier signal $F_{IN}$ is input to a power divider 26, for demodulation by the frequency-agile synchronous demodulator 10, through a tracking bandpass filter 27. The tracking bandpass filter 27 limits the total amount of power that enters the phase control loop 13 to prevent overload. The tracking bandpass filter 27 does not provide any adjacent channel rejection. The tracking bandpass filter 27 is tuned by the same signal that tunes the voltage controlled oscillator 18 and tracks in frequency the local oscillator signal $F_{VCO}$. The power divider 26 produces first and second signals representative of $F_{IN}$, both of which are in phase therewith. As will be discussed further hereinafter, the frequency-agile synchronous demodulator 10 is tuned to select the desired modulated carrier signal (here designated $F_{IN}$) from among the plurality of modulated carrier signals carried by the communications medium.

In a quadrature-phase channel (also referred to as the Q channel), a first signal from the power divider 26 is input to a mixer 28 for mixing with the quadrature-phase signal. A mixed signal, produced by the mixer 28, includes sum and difference frequency terms, and each term includes the phase angle between the two mixed signals.

In an in-phase channel (also referred to as the I channel), a mixer 32 mixes the in-phase signal from the power divider 22 and a second signal from the power divider 26. A mixed signal from the mixer 32 includes sum and difference frequency terms, and each term includes the phase angle between the two mixed signals.

In equation form, the mixers 28 and 32 function as follows. For simplicity, first assume there is no modulation, then $$F_{IN} = A \cos(\omega_{IN} t + \theta)$$

$$F_{VCO} = B \cos(\omega_{VCO} t + \phi)$$

where
$\theta$ = random phase angle of $F_{IN}$, and
$\theta$ = random phase angle of $F_{VCO}$.
The mixer 32, of the in-phase channel, mixer or multiples $F_{IN}$ and $F_{VCO}$, producing the product, $$A\cos(\omega_{IN} t + \theta) B\cos(\omega_{VCO} t + \phi) = (\tfrac{1}{2})AB\cos(\omega_{IN} t + \theta - \omega_{VCO} t - \phi) + (\tfrac{1}{2})AB\cos(\omega_{IN} t + \theta + \omega_{VCO} t + \phi). \quad (1)$$

If the signal $F_{VCO}$ is frequency coherent with the signal $F_{IN}$, then $$\omega_{IN} = \omega_{VCO}$$

and therefore equation (1) reduces to $$(\tfrac{1}{2})AB \cos(\theta - \phi) + (\tfrac{1}{2})AB \cos(2\omega_{VCO} t + \theta + \phi) \quad (2)$$

In a low-pass filter 34 the second term of equation (2) (i.e, the sum term) is filtered out, leaving $$(\tfrac{1}{2})AB \cos(\theta - \phi) \quad (3)$$

The mixer 28 in the quadrature-phase channel mixes or multiplies $F_{VCO}$ phase-shifted by 90° and $F_{IN}$, producing the product, $$A\cos(\omega_{IN} t + \theta) B\sin(\omega_{VCO} t + \phi) = (\tfrac{1}{2})AB\sin(\omega_{IN} t + \theta - \omega_{VCO} t - \phi) + (\tfrac{1}{2})AB\sin(\omega_{IN} t + \theta - \omega_{VCO} t - \phi) \quad (4)$$

If the signal $F_{VCO}$ is frequency coherent with the signal $F_{IN}$, then $$\omega_{IN} = \omega_{VCO}$$

and therefore equation (3) reduces to $$(\tfrac{1}{2})AB \sin(2\omega_{VCO} t + \theta + \phi) + (\tfrac{1}{2})AB \sin(\theta - \phi) \quad (5)$$

In a low-pass filter 30 the first term of equation (5) (i.e., the sum term) is filtered out, leaving $$(\tfrac{1}{2})AB \sin(\theta - \phi) \quad (6)$$

The signals representing equations (3) and (6) are multiplied in a multiplier 36, $$(\tfrac{1}{2})AB\cos(\theta - \phi)(\tfrac{1}{2})AB\sin(\theta - \phi) = (\tfrac{1}{4})A^2 B^2 \sin(\theta - \phi + \theta - \phi) - (\tfrac{1}{4})A^2 B^2 \sin(\theta - \phi - \theta + \phi) = \quad (7)$$

$$(\tfrac{1}{4})A^2 B^2 \sin 2(\theta - \phi)$$

The frequency-agile synchronous demodulator 10 continues to adjust the phase of the signal $F_{VCO}$ until a locked condition is achieved. A locked condition is defined as that state when $$\theta = \phi$$

When this occurs, equation (6) (the output signal from the low pass filter 30) and equation (7) (the output signal from the multiplier 36) go to zero, the output signal from integrators 38 and 16 (to be discussed further hereinafter) are constant, and the frequency and phase of the signal $F_{VCO}$ are locked to the frequency and phase of the signal $F_{IN}$.

Now consider the effects of phase modulation, $$F_{IN} = A \cos(\omega_{IN} t + \phi + m(180°))$$

where m=0 or 1 for biphase-shift keying.
After low-pass filtering, the in-phase channel signal (analagous to equation (3)) is:

$$(\tfrac{1}{2}AB \cos(\theta - \phi - m(180°)) \quad (8)$$

After low-pass filtering the quadrature-phase channel signal (analagous to equation (6)) is:

$$(\tfrac{1}{2})AB \sin(\theta - \phi - m(180°)) \quad (9)$$

The signals represented by equations (8) and (9) are multiplied in the multiplier 36, producing $$(\tfrac{1}{2})AB\cos(\theta - \phi - m(180°))\ (\tfrac{1}{2})AB\sin(\theta - \phi - m(180°)) =$$

$$(\tfrac{1}{4})A^2B^2\sin 2(\theta - \phi - m(180°)) = (\tfrac{1}{4})A^2B^2\sin(2(\theta - \phi) - m(360°))$$

The second term in the sin argument can be dropped because it always adds some multiple of 360° and is therefore unnecessary. The result of this simplification is $$(\tfrac{1}{4})A^2B^2 \sin(2(\theta-\phi)) \quad (10)$$

Note that equation (10) is identical to the unmodulated case represented by equation (7). This result shows that phase modulation does not effect the error term, but as expected, it is significant in the result of equation (8), which represents the demodulated signal, designated $F_{OUT}$ in the Figure.

Considering equation (10), the frequency-agile synchronous demodulator 10 continues to adjust the phase of the signal $F_{VCO}$ until a locked condition, defined as $\phi = \theta$, is achieved. When this occurs, equation (10), (the output signal from the multiplier 36) goes to zero, the output signals from integrators 38 and 16 (to be discussed further hereinafter) are constant, and the frequency and phase of the signal $F_{VCO}$ are locked to the frequency and phase (i.e., frequency and phase coherent) of the modulated carrier signal $F_{IN}$, so that proper demodulation thereof occurs. When this condition occurs, there is no signal, ideally, appearing out of the low-pass filter 30 and the frequency-agile synchronous demodulator 10 is locked and demodulating properly. Equation (8) represents the demodulated signal, designated FOUT in the Figure.

As discussed above, the multiplier 36 is responsive to the signal from the low-pass filter 34 (FOUT) and the signal from the low-pass filter 30 to produce a multiplication signal. The multiplication signal has the correct polarity to cause the frequency-agile synchronous demodulator 10 to lock, i.e., to lock the phase of the local oscillator signal $F_{VCO}$ to the phase of the modulated carrier signal $F_{IN}$. Note that the phase of $F_{VCO}$ will generally follow the phase of $F_{IN}$ when the frequency-agile synchronous demodulator 10 is locked, but due to the multiplication action of the multiplier 36, the information-containing phase reversals of $F_{IN}$ do not perturbate $F_{VCO}$.

The multiplication signal is integrated by the integrator 38 to produce the error signal $E_2$. $E_2$ is a dc voltage that is constant only when the multiplication signal from the multiplier 36 is zero, and the multiplication signal is zero only when the output signal from the low-pass filter 30 or the output signal from the low-pass filter 34 is zero. The case of the output signal from the low-pass filter 34 being zero is not stable and will not persist if it does occur. The case of the output signal from the low-pass filter 30 being zero is stable and, as previously discussed, represents a locked condition.

The multiplier 36 can be implemented using several well known schemes including a chopper multiplier, an analog multiplier, or a synchronous switch. The integrator 38 can be implemented using any of the well-known integration techniques, including an operational-amplifier-based integrator or a lag-lead filter.

The error signal $E_2$ from the integrator 38 is provided as an input to a summer 14. A phase detector 15 is responsive to the frequency reference signal $F_R$ and to a converted oscillator signal, converted to the scale of $F_{IN}$ by a divider 20. $F_R$ is related to the input signal $F_{IN}$ by the relationship $N \times F_R = F_{IN}$. According to the above relationship of $F_R$ and $F_{IN}$, the error signal $E_1$ from the phase detector 15 is of equal magnitude and opposite polarity to the error signal $E_2$. $E_1$ is provided as an input to the summer 14. The summer 14 responsively produces an error signal $E_3$ that is provided to the integrator 16. The integrator 16 provides a control signal, responsive to the error signal $E_3$, to the voltage-controlled oscillator 18 for controlling the phase and frequency of the local oscillator signal $F_{VCO}$.

Two conditions must exist for the frequency-agile phase demodulator 10 to be locked onto the correct frequency signal, $F_{IN}$. First, the error signal $E_3$ must be substantially zero (i.e., the error signal $E_1$ must be of equal amplitude and opposite polarity to the error signal $E_2$ such that summing the two signals in the summer 14 produces a substantially zero value for the error signal $E_3$.) When the error signal $E_3$ has a substantially zero value the output signal from the integrator 16 is constant, and therefore, the phase and frequency of the signal $F_{VCO}$ remain constant. Second, the signal from the multiplier 36 must be zero; this is the definition of a locked Costas loop. If only the second condition is satisfied, the frequency-agile synchronous demodulator 10 will be locked, but perhaps not to the correct frequency signal $F_{IN}$.

The error signal $E_1$ from the phase detector 15 represents the phase difference between the frequency reference signal $F_R$ and the converted oscillator signal from the divider 20. This phase difference, when effectively scaled up by a factor N in the divider 20, represents the amount the phase of the local oscillator signal $F_{VCO}$ has to be shifted so that $F_{VCO}$ and the modulated carrier signal $F_{IN}$ are in phase. When this in-phase relationship is established, the error signal $E_1$ is of equal amplitude and opposite polarity to the error signal $E_2$.

If the multiplication signal from the multiplier 36 is not zero, the error signal $E_2$ will continue slewing until the multiplication signal reaches zero. If necessary, the error signal $E_1$ will now change until the relationship $E_1 = -E_2$ is satisfied. In the preferred embodiment, the error signals $E_1$ and $E_2$ are interelated and interact until both conditions discussed above are satisfied, to provide demodulation of the modulated carrier signal $F_{IN}$.

In the preferred embodiment the frequency-agile phase demodulator 10 may be tuned in frequency by changing the constant N associated with the divider 20. This can be accomplished manually or automatically under microprocessor control. The frequencies of the frequency reference signal $F_R$, the local oscillator signal $F_{VCO}$, and the modulated carrier signal $F_{IN}$ are related by the relationahip $NF_R = F_{IN} = F_{VCO}$, when the frequency-agile synchronous demodulator 10 is locked to $F_{IN}$. Changing the constant N changes the frequency of $F_{VCO}$. The error signal $E_1$ responds to a change in N, causing the frequency of the local oscillator signal $F_{VCO}$ from the voltage-controlled oscillator 18 to shift to satisfy the relationship $NF_R = F_{VCO}$. Since the frequency-agile synchronous demodulator 10 demodulates properly only when $F_{IN}$ and $F_{VCO}$ are frequency and phase coherent, when $F_{VCO}$ is shifted in frequency, the frequency of the modulated carrier that is to be demodulated is similarly shifted.

One application for the present invention is a data network to which are connected several modems for receiving and transmitting data. Such a network is disclosed and claimed in U.S. patent application Ser. No.

6,721,645 filed Apr. 10, 1985, entitled "Switched Point-to-Point Local Area Network Control Mechanism", and assigned to the assignee of the present invention. In this application, the frequency reference signal $F_R$ is transmitted to all modems in the network to ensure frequency coherency, and the frequency-agile synchronous demodulator 10 is included in each receiver to ensure proper demodulation of the correct frequency signal. The present invention can also be used to demodulate any signal where the information is contained in phase reversals of the modulated signal. No intermediate frequency stages are required.

Any one of several well-known techniques can be used with the present invention to provide gain control to compensate for wide dynamic variations in the modulated carrier signal $F_{IN}$. One technique for accomplishing this is disclosed and claimed in commonly-assigned U.S. patent application Ser. No. 6,721,974, filed Apr. 10, 1985, entitled "Global Network Equalization System and Method".

What is claimed is:

1. A frequency-agile synchronous demodulator for demodulating a carrier signal modulated by an information signal, wherein said frequency-agile synchronous demodulator is tunable for demodulating any modulated carrier signal within a band of carrier frequencies, and wherein said frequency-agile synchronous demodulator comprises:

means for providing an oscillating signal;

processor means responsive to said oscillating signal and the modulated carrier signal for producing a first signal representing the phase difference between said oscillating signal and the modulated carrier signal;

means for receiving a frequency-reference signal, having a frequency related to the frequency of the modulated carrier signal which it is desired to demodulate;

phase detector means responsive to said frequency-reference and said oscillating signals for producing a second signal representing the phase difference between said frequency-reference and said oscillating signals; and wherein said means for providing said oscillating signal is responsive to said first and second signals for controlling the frequency and phase of said oscillating signal to lock said oscillating signal to the frequency and phase of the desired modulated carrier signal for demodulation thereof.

2. The frequency-agile synchronous demodulator of claim 1 wherein in the locked condition the frequencies of the frequency-reference signal $F_R$, the modulated carrier signal which it is desired to demodulate $F_{IN}$, and the oscillating signal $F_{VCO}$ are related by the relationship $F_{IN}=F_{VCO}=NF_R$.

3. The frequency-agile synchronous demodulator of claim 2 including means responsive to the frequency reference signal $F_R$ for adjusting the frequency thereof by the factor N, wherein tuning of the frequency-agile synchronous demodulator to demodulate any modulated carrier signal is accomplished by changing the factor N.

4. The frequency-agile synchronous demodulator of claim 2 including means responsive to the oscillating signal $F_{VCO}$ for adjusting the frequency thereof by the factor 1/N, wherein tuning of the frequency-agile synchronous demodulator to demodulate any modulated carrier signal is accomplished by changing the factor 1/N.

5. The frequency-agile synchronous demodulator of claim 1 wherein tuning thereof to demodulate any modulated carrier signal $F_{IN}$ is accomplished by changing the frequency of the frequency-reference signal.

6. The frequency-agile synchronous demodulator of claim 1 wherein the oscillating signal locks to the frequency and phase of the desired modulated carrier signal when the first signal indicates that the oscillating and carrier signals are phase coherent, and the second signal indicates that the frequency-reference and the oscillating signals are phase coherent.

7. The frequency-agile synchronous demodulator of claim 6 wherein the oscillating signal first locks to the frequency of the desired modulated carrier signal and then to the phase thereof.

8. A frequency-agile synchronous demodulator for demodulating a carrier signal modulated by an information signal, wherein said frequency-agile synchronous demodulator is tunable for demodulating any modulated carrier signal within a band of carrier frequencies, and wherein said frequency-agile synchronous demodulator comprises:

means for providing an in-phase, a quadrature-phase, and an oscillating signal;

first mixer means responsive to said in-phase signal and the modulated carrier signal for producing a first mixed signal representing the in-phase component of the carrier signal;

second mixer means responsive to said quadrature-phase and the modulated carrier signals for producing a second mixed signal representing the quadrature-phase component of the carrier signal;

processor means responsive to said first and said second mixed signals for producing a phase-difference signal representing the phase difference between the carrier signal and said in-phase signal;

first integrator means responsive to said phase-difference signal for integrating said phase-difference signal to produce a first error signal;

means for receiving a frequency reference signal, having a frequency related to the frequency of the modulated carrier signal which is is desired to demodulate by a factor N;

divider means responsive to said oscillating signal for changing the frequency thereof by said factor N to produce a comparison signal having a frequency equal to the frequency of said frequency reference signal; and wherein said means for providing said in-phase, said quadrature-phase, and said oscillating signals is responsive to said frequency reference signal, said comparison signal, and said first error signal, for controlling the frequency and phase of said in-phase, said quadrature-phase, and said oscillating signals until said first error signal and the phase difference between said frequency reference signal and said comparison signal indicate that said oscillating signal is frequency and phase coherent with the desired modulated carrier signal, and wherein said oscillating signal is locked to the desired modulated carrier signal, and wherein said second mixed signal represents the information signal.

9. The frequency-agile synchronous demodulator of claim 8 wherein the means for providing the in-phase, the quadrature phase, and the oscillating signals includes:

voltage-controlled oscillator means for producing the in-phase, signal wherein the divider means is responsive to said in-phase signal for producing the comparison signal;

means responsive to the oscillating signal for producing the in-phase and the quadrature-phase signals;

phase detector means responsive to the frequency reference signal and the comparison signal for producing a second error signal representing the phase difference between the frequency reference signal and the comparison signal;

summer means for summing the first error signal and said second error signal to produce a sum signal;

integrating means responsive to said sum signal for producing an integrated signal;

wherein said voltage-controlled oscillator means is responsive to said integrated signal for controlling the frequency and phase of oscillating signal; and wherein when the phase-difference signal is zero and the first error signal is of equal amplitude and opposite polarity to said second error signal then the oscillating signal is locked to the frequency and phase of the desired modulated carrier signal for demodulation thereof.

10. The frequency-agile synchronous demodulator of claim 8 wherein the first mixer means includes:

multiplier means responsive to the in-phase and desired modulated carrier signals for producing a product signal; and low pass filter means for filtering the sum-frequency component of the product signal to produce the first mixed signal.

11. The frequency-agile synchronous demodulator of claim 8 wherein the second mixer means includes:

multiplier means responsive to the quadrature-phase and desired modulated carrier signals for producing a product signal; and low pass filter means for filtering the sum-frequency component of the product signal to produce the second mixed signal.

12. The frequency-agile synchronous demodulator of claim 8 wherein the processor means includes a chopper multiplier.

13. The frequency-agile synchronous demodulator of claim 8 wherein the processor means includes an analog multiplier.

14. The frequency-agile synchronous demodulator of claim 8 wherein the processor means includes a synchronous switch.

15. The frequency-agile synchronous demodulator of claim 8 wherein the first integrating means includes a lag-lead filter.

16. The frequency-agile synchronous demodulator of claim 8 wherein the frequency-agile synchronous demodulator is tuned by changing the factor N.

17. A frequency-agile synchronous demodulator for demodulating a carrier signal modulated by an information signal, wherein said frequency-agile synchronous demodulator is tunable for demodulating a desired modulated carrier signal within a band of modulated carrier signals, and wherein said frequency-agile synchronous demodulator comprises:

means for providing an in-phase signal, a quadrature-phase signal, and an oscillating signal, wherein said in-phase, said quadrature-phases, and said oscillating signals are frequency-coherent and wherein said in-phase and said oscillating signals are phase coherent, and wherein said quadrature-phase signal has a 90° phase angle with respect thereto, first mixer means for mixing said in-phase signal and the desired modulated carrier signal to produce a first mixed signal representing the in-phase component of the desired modulated carrier signal;

second mixer means for mixing said quadrature-phase signal and the desired modulated carrier signal to produce a second mixed signal representing the quadrature-phase component of the desired modulated carrier signal;

means responsive to the in-phase and quadrature-phase components for producing a phase-difference signal representing the phase difference between the desired modulated carrier signal and said in-phase component;

first integrator means for integrating said phase-difference signal to produce a first error signal;

means for receiving a frequency-reference signal, having a frequency related to the frequency of the carrier signal by a selectable factor N;

means responsive to said oscillating signal for scaling said oscillating signal by said selectable factor N to produce a scaled signal having a frequency equal to the frequency of said frequency-reference signal;

phase detector means responsive to said frequency-reference signal and said scaled signal for producing a second error signal representing the phase difference between said frequency-reference and said oscillating signals;

summer means for adding said first and second error signals to produce a sum signal;

second integrator means for integrating said sum signal; and wherein said sum signal is supplied to said means for providing said in-phase signal, said quadrature-signal, and said oscillating signal for controlling the frequency and the phase thereof, such that when said first error signal is substantially constant and said sum signal is substantially zero, said frequency-agile synchronous demodulator is locked onto the desired modulated carrier signal, said oscillating signal is frequency and phase coherent with the desired modulated carrier signal, and said second mixed signal represents the information signal.

18. A frequency-agile phase-locked loop for locking to a carrier signal modulated by an information signal, wherein said frequency-agile phase-locked loop is tunable for locking to any carrier signal within a band of carrier frequencies, and wherein said frequency-agile phase-locked loop comprises:

means for providing an input signal;

means for providing an oscillating signal;

processor means responsive to said oscillating signal and said input signal for producing a first signal representing the phase difference between said oscillating signal and said input signal;

means for receiving a frequency-reference signal, having a frequency related to the frequency of said input signal;

phase detector means responsive to said frequency-reference and said oscillating signals for producing a second signal representing the phase difference between said frequency-reference and said oscillating signals;

wherein said oscillating means is responsive to said first and second signals for controlling the frequency and phase of said oscillating signal to lock said oscillating signal to the frequency and to the phase of the input signal.

19. A method for demodulating a carrier signal, modulated by an information signal, within a band of carrier frequencies, said method comprising the steps of:
providing an oscillating signal;
producing a first signal representing the phase difference between said oscillating signal and the modulated carrier signal;
receiving a frequency-reference signal, having a frequency related to the frequency of the modulated carrier signal which it is desired to demodulate;
producing a second signal representing the phase difference between said frequency-reference and said oscillating signals; and
wherein said first and second signals control the frequency and phase of said oscillating signal to lock said oscillating signal to the frequency and to the phase of the desired modulated carrier signal for demodulation thereof.

20. The method of claim 19 wherein the step of receiving the frequency-reference signal includes receiving the frequency-reference signal ($F_R$) having a frequency related to the frequency of the oscillating signal ($F_{VCO}$) and the frequency of the desired modulated carrier signal ($F_{IN}$), by the relationship $NF_R = F_{VCO} = F_{IN}$.

21. The method of claim 20 including the step of adjusting the frequency of the frequency-reference signal ($F_R$) by the factor N, wherein any modulated carrier signal can be demodulated by changing the factor N.

22. The method of claim 20 including the step of adjusting the frequency of the oscillating signal ($F_{VCO}$) by the factor 1/N, wherein any modulated carrier signal can be demodulated by changing the factor 1/N.

23. The method of claim 20 wherein demodulating another desired modulated carrier signal ($F_{IN}'$) includes the step of adjusting the factor N to N' to produce a converted oscillating signal ($F_{VCO}'$), wherein $N'F_R = F'_{VCO} = F'_{IN}$.

24. The method of claim 19 including the step of changing the frequency of the frequency-reference signal to demodulate any modulated carrier signal.

25. The method of claim 19 including the step of mixing the oscillating signal with the desired modulated carrier signal for demodulation thereof.

26. A method of tuning a phase synchronous demodulator to a desired carrier of a predetermined frequency ($F_{IN}$), within a broadband input containing a plurality of carriers at separate respective frequencies ($F_1, F_2, F_3, \ldots, F_n$), comprising the steps of:
(a) producing a reference signal having a frequency ($F_R$) related to said desired carrier ($F_{IN}$) frequency by a factor N;
(b) producing a demodulating signal ($F_{VCO}$);
(c) comparing said demodulating signal ($F_{VCO}$) with said reference signal ($F_R$) to produce a comparison signal indicative of the difference in frequency between said demodulating signal ($F_{VCO}$) and said reference carrier ($F_R$);
(d) responsive to said comparison signal of step (c), adjusting said demodulating signal ($F_{VCO}$) to be substantially the frequency of said desired carrier ($F_{IN}$).

27. The method of claim 26 including the step (e) of applying said demodulating signal ($F_{VCO}$) to said desired carrier ($F_{IN}$) to demodulate said desired carrier ($F_{IN}$).

28. The method of claim 26 wherein said step (c) includes the step (f) of converting said demodulating signal frequency ($F_{VCO}$) by said factor N, to produce a converted demodulating carrier ($CF_{VCO}$); and (g) comparing said converted demodulating carrier ($CF_{VCO}$) of step (f) with said reference carrier to produce a frequency comparison signal indicative of the difference in frequency between said demodulating carrier ($F_{VCO}$) and said reference carrier ($F_R$).

29. The method of claim 26 wherein tuning said demodulator to another carrier ($F_{IN}'$) within said plurality of carriers includes the step (h) of converting said demodulating signal frequency ($F_{VCO}$) by a factor N to produce a converted demodulating carrier ($CF_{VCO}'$), and (i) comparing said converted demodulating signal ($CF_{VCO}'$) of step (h) with said reference signal ($F_R$) to produce a frequency comparison signal indicative of the difference in frequency between said converted demodulating signal ($CF_{VCO}'$) and said reference signal ($F_R$), and (j) responsive to said comparison signal of step (c), adjusting said demodulating signal ($F_{VCO}'$) to be substantially the frequency of said another carrier ($F_{IN}'$).

30. The method of claim 29 wherein said step (h) of converting includes a step of dividing or multiplying the said demodulating carrier ($F_{VCO}$) by said factor N'

31. The method of claim 28 wherein said step (f) of converting includes the step (k) of dividing or multiplying said demodulating carrier ($F_{VCO}$) by said factor N.

32. The method of claim 27 including the step (l) of comparing said demodulating carrier ($F_{VCO}$) to said reference carrier ($F_{IN}$) to produce a phase comparison signal indicative of the difference in phase between said demodulating carrier ($F_{VCO}$) and said desired carrier ($F_{IN}$), (m) responsive to said phase comparis on signal of step (l) adjusting said demodulating carrier ($F_{VCO}$) to be in phase synchronism with said desired carrier ($F_{VCO}$)

33. The method of claim 32 including the step (n) of arranging the response time of step (d) to be related to the response time of step (m) by a factor F, wherein said factor F is greater than 1.

34. The method of claim 29 including the step (o) of applying said demodulating signal ($F_{VCO}'$) of step (i) to said another carrier ($F_{IN}'$) to demodulate said another carrier ($F_{IN}'$),
(p) comparing said demodulating signal ($F_{VCO}'$) to said another carrier ($F_{IN}'$) to produce a phase comparison signal indicative of the difference in phase between said demodulating signal ($F_{VCO}'$) and said another desired carrier ($F_{IN}'$), and
(q) responsive to said phase comparisons signal of step
(p), adjusting said demodulating signal ($F_{VCO}'$) to be in phase synchronism with said another desired carrier ($F_{IN}'$).

35. The method of claim 34 including the step (r) of arranging the response time of step (j) to be related to the response time of step (q) by a factor F', wherein said factor F' is greater than 1.

36. The method of claim 32 wherein said steps (c) and (l) include the step (s) of combining said frequency comparison signal and phase comparison signal to produce a combined frequency and phase error signal and said steps (d) and (m) includes the step (t) of adjusting said demodulating carrier in response to said combined frequency and phase error signal.

37. The method of claim 34, wherein said steps (i) and (p) include the step (v) of combining said frequency comparison signal of step (i) and said phase comparison signal of step (p) to produce a combined frequency and phase error signal and said steps (i) and (p) includes the step (w) of adjusting said demodulating signal ($F_{VCO}'$) in response to said combined frequency and phase error signal.

* * * * *